US010168231B2

(12) United States Patent
Pollock et al.

(10) Patent No.: US 10,168,231 B2
(45) Date of Patent: Jan. 1, 2019

(54) GALVANICALLY ISOLATED MONITORING CIRCUIT

(71) Applicant: TECHNELEC LTD, Oakham (GB)

(72) Inventors: Charles Pollock, Leicestershire (GB); Helen Pollock, Leicestershire (GB)

(73) Assignee: TECHNELEC LTD, Oakham (GB)

( * ) Notice: Subject to any disclaimer, the term of this patent is extended or adjusted under 35 U.S.C. 154(b) by 254 days.

(21) Appl. No.: 15/026,968

(22) PCT Filed: Oct. 1, 2014

(86) PCT No.: PCT/GB2014/052962
§ 371 (c)(1),
(2) Date: Apr. 2, 2016

(87) PCT Pub. No.: WO2015/049510
PCT Pub. Date: Apr. 9, 2015

(65) Prior Publication Data
US 2016/0258820 A1   Sep. 8, 2016

(30) Foreign Application Priority Data

Oct. 3, 2013   (GB) .................................. 1317496.6

(51) Int. Cl.
G01K 7/22 (2006.01)
G01K 7/20 (2006.01)
(Continued)

(52) U.S. Cl.
CPC ............. G01K 7/22 (2013.01); G01K 7/20 (2013.01); G01K 7/24 (2013.01); G01K 15/005 (2013.01); G01R 27/02 (2013.01)

(58) Field of Classification Search
CPC .. G01K 7/22; G01K 7/20; G01K 7/24; G01K 15/005; G01R 27/02
See application file for complete search history.

(56) References Cited

U.S. PATENT DOCUMENTS 3,959,786 A * 5/1976 Chana .................... G01R 19/18
340/870.39
5,059,902 A * 10/1991 Linder .................... G01B 7/023
324/204

(Continued)

FOREIGN PATENT DOCUMENTS

GB    1 286 523 A    8/1972
WO   WO 93/14394 A1   7/1993

OTHER PUBLICATIONS

International Search Report and Written Opinion for corresponding International Application No. PCT/GB2014/052962 dated Jan. 8, 2015.

(Continued)

Primary Examiner — Lisa Caputo
Assistant Examiner — Philip Cotey
(74) Attorney, Agent, or Firm — Renner, Otto, Boisselle & Sklar, LLP

(57) ABSTRACT

There is described a system for measuring an environmental parameter such as temperature experienced by a resistive component such as a thermistor (107) in a galvanically isolated circuit, or for measuring the voltage developed by a component. The system comprises a measurement circuit (1) comprising a voltage pulse generator (114). The measurement circuit is inductively coupled to the galvanically isolated circuit by a flyback transformer (101) such that a stable voltage (V104) across a first capacitor (114) in the measurement circuit after many voltage pulses is proportional to a stable voltage (V106) across a second capacitor (106) connected across the component in the galvanically isolated circuit. The stable voltages across the first and second capacitors are adjustable by adjusting a duty cycle of the voltage pulses.

25 Claims, 4 Drawing Sheets

(51) Int. Cl.
*G01K 7/24* (2006.01)
*G01K 15/00* (2006.01)
*G01R 27/02* (2006.01)

(56) References Cited

U.S. PATENT DOCUMENTS

| | | | |
|---|---|---|---|
| 5,682,748 A | 11/1997 | Devilbiss | |
| 6,809,678 B2* | 10/2004 | Vera | H02J 1/102 |
| | | | 323/299 |
| 7,684,221 B2* | 3/2010 | Gruber | H02M 1/08 |
| | | | 327/109 |
| 8,627,511 B2* | 1/2014 | Polesel | G01Q 10/06 |
| | | | 850/4 |
| 9,093,911 B2* | 7/2015 | Telefus | H02M 3/33576 |
| 9,118,253 B2* | 8/2015 | Telefus | H02M 3/33576 |
| 2002/0150140 A1 | 10/2002 | Julicher | |
| 2004/0012986 A1* | 1/2004 | Riggio | H02M 1/4225 |
| | | | 363/26 |
| 2004/0114404 A1* | 6/2004 | Brkovic | H02M 3/28 |
| | | | 363/80 |
| 2006/0122473 A1* | 6/2006 | Kill | G01J 5/04 |
| | | | 600/300 |
| 2009/0278489 A1* | 11/2009 | St-Jacques | H02J 7/0016 |
| | | | 320/103 |
| 2010/0091815 A1 | 4/2010 | Nakazato | |
| 2011/0110129 A1* | 5/2011 | Busch | H02J 9/005 |
| | | | 363/53 |
| 2014/0112028 A1* | 4/2014 | Fahlenkamp | G01R 22/06 |
| | | | 363/21.12 |
| 2014/0112030 A1* | 4/2014 | Fahlenkamp | H02M 3/33507 |
| | | | 363/21.14 |
| 2014/0204622 A1* | 7/2014 | Telefus | H02M 3/33523 |
| | | | 363/21.02 |
| 2014/0268901 A1* | 9/2014 | Telefus | H02M 3/33576 |
| | | | 363/21.01 |

OTHER PUBLICATIONS

British Search Report dated Mar. 24, 2014 for corresponding British Application No. GB1317496.6.
Communication under Rule 71(3) EPC indicating allowance for corresponding EP Application No. 14 781 633.4, dated Jan. 3, 2018.

* cited by examiner

GALVANICALLY ISOLATED MONITORING CIRCUIT

The present invention relates to a galvanically isolated monitoring circuit suitable for monitoring variations in voltage. In particular, although not exclusively, this voltage can be used to determine variations in resistive components, or monitoring a voltage developed by another circuit. The invention is particularly suited for monitoring temperature or monitoring a control voltage or control current.

In many control systems it is important to monitor the value of temperature and to use the measurement to adjust a control output, such as the speed of a motor driving a fan, pump or compressor.

Temperature can be measured with a thermistor, a component whose resistance varies with temperature. Thermistors with a negative temperature coefficient of resistance are often referred to as NTC thermistors.

Often the measurement surface or the measurement medium is exposed, and any electrical contact with the component in the medium must be galvanically isolated from an ac supply to avoid the risk of electrical shock. One example where this is particularly important is in the measurement of water temperature. A thermistor placed in the water must be galvanically isolated from earth since the water is likely to be flowing through copper pipes which are earthed.

US 2002/0150140 describes the use of a transformer to inductively couple a thermistor to a measurement pulse, and the circuit employed is shown in FIG. 1. The method measures the voltage drop across a transformer during the application of a voltage pulse. The current passing through the transformer will be a function of the resistance of the thermistor and by using an additional resistance in series with the primary of the transformer any variation in the resistance of the thermistor can be detected by variation of the voltage developed across the transformer during a specified part of the pulse.

This approach has a number of difficulties:
1. The voltage across the transformer varies significantly during the pulse, so the point of measurement needs to be chosen very carefully to obtain reliable results;
2. The magnetic coupling and equivalent circuit of a transformer can vary significantly from one transformer to another, causing significant measurement errors if the circuit is used in a design for series production;
3. There are large variations in the manufacturing tolerance of cheap thermistors, but the circuit relies on an accurate knowledge of the behaviour of the thermistor.

The use of a transformer to provide the galvanic isolation is a very simple and low cost method. However, simple transformers are known to have large variations in their magnetic and electrical characteristics. Whilst the magnitude of the electrical coupling between the primary and secondary of a transformer is predominantly determined by the number of turns on the primary and secondary windings; the resistance of the windings, the leakage between primary and secondary, the magnetising inductance and the magnetising current all introduce significant variations in the signal transferred across a transformer. This is particularly evident in low cost transformers where manufacturing tolerances result in significant variations between components.

Similar issues arise in industrial control and sensor systems, where the internationally accepted standard control or feedback signals are a variable voltage of 0-10V or a variable current of 4-20 mA. A transmitter device supplies the control voltage or the control current and a receiver device needs to measure the signal, measure it and respond appropriately. In such systems it is possible for one or more receivers to be in an industrial control system with one or more transmitters. It is therefore necessary that a receiver can monitor the signal through a galvanically isolated connection. A 4-20 mA loop current can be turned into a voltage by passing it through a resistor. A precision resistor of 250Ω is commonly used as the receiver resistor because this develops a voltage of 1V at 4 mA and 5V at 20 mA. Semiconductor solutions involving isolation amplifiers or linear opto-couplers can be employed but typically such circuits also require a power supply on the galvanically isolated side of the circuit. A simple and low cost circuit is required for a receiver to monitor the control voltage or a voltage developed by a control current.

It would thus be desirable to provide a circuit which is sensitive to an environmental parameter, voltage or resistance being measured, but which is capable of compensating for component tolerances.

In accordance with one aspect of the present invention there is provided a system for monitoring a voltage across a component. This voltage may be a voltage developed by the component or may be representative of an electrical resistance of the component. The system comprises a measurement circuit, a galvanically isolated circuit and a voltage measuring device. The measurement circuit comprises a primary inductor, a voltage pulse generator for applying voltage pulses across the primary inductor, a first capacitor and a first resistance connected across the first capacitor. The galvanically isolated circuit comprises a secondary inductor, a second capacitor and the component connected across the second capacitor. The voltage measuring device is configured to measure a voltage across the first capacitor. The primary and secondary inductors are inductively coupled by a magnetic core to form a flyback transformer. The galvanically isolated circuit is configured such that a current cannot flow in a first direction through the galvanically isolated circuit during the voltage pulses. The configuration is such that, during the voltage pulses, energy is stored in the magnetic core, and between pulses the energy is released into the first and second capacitors, so that, after many pulses, a substantially stable voltage $V_{C1}$ across the first capacitor is proportional to a substantially stable voltage $V_{C2}$ across the second capacitor, and $V_{C1}$ is representative of the resistance of, or voltage developed by, the component. The many pulses would be expected to have an approximately constant duty cycle, or a duty cycle that changes only slowly with time.

$V_{C1}$ and $V_{C2}$ may be variable in dependence on the duty cycle of the voltage pulses and are optionally substantially proportional to the duty cycle of the voltage pulses.

The voltage pulse generator comprises a voltage source and a pulse generator connected to a gate of a transistor, optionally a field effect transistor such as a mosfet.

The measurement circuit may comprise a first diode connected in series with the first capacitor such that the first diode is reverse biased during the voltage pulses. The galvanically isolated circuit may comprise a second diode connected in series with the second capacitor such that the second diode is reverse biased during the voltage pulses so as to prevent current flow in the first direction.

The component may be configured to monitor an environmental parameter, such that a change in the environmental parameter results in a change in resistance of the component. The component may be a thermistor for measuring temperature.

The component may develop a voltage representative of a control parameter, such that a change in the control parameter results in a change in voltage to be monitored. The control parameter may be a control signal in the form of a variable voltage or a voltage developed by a control current passing through a known resistance.

The system may further comprise a controller configured to monitor a measured value of $V_{C1}$, and to determine a value of the environmental parameter or control parameter from $V_{C1}$. The controller is optionally coupled to the voltage pulse generator, and configured to calibrate a relationship between $V_{C1}$ and the environmental parameter or control parameter. The calibration may be achieved by measuring $V_{C1}$ when the component experiences a known constant value of the parameter, calculating an error from an expected value of $V_{C1}$ for the known value, and adjusting the duty cycle of the voltage pulses until $V_{C1}$ matches the expected value. The controller may be configured to store the duty cycle at which $V_{C1}$ matches the expected value The controller may be configured to calibrate $V_{C1}$ for two or more known values of the parameter experienced by the component, store the required duty cycle for each known value, and use the stored duty cycles to choose a suitable duty cycle when measuring an unknown value of the environmental parameter or control parameter.

Thus this invention provides a way to use a low cost transformer to galvanically isolate a component which is sensitive to the environmental or control parameter being measured. The invention includes a circuit which makes it possible to implement a method to substantially null out all the component tolerances such that accurate and consistent measurements of the parameter of interest can be made without an expensive circuit.

A further feature is that it allows an accurate differential measurement to be made between two components. A different transformer can be used for each component to provide independent galvanic isolation from each other and from the measurement circuit. A method is provided to eliminate characteristic variations between the two transformers and between the two components so that at the standard environmental conditions the differential signal between the two channels is zero.

Thus the system may further comprise a second measurement circuit and a second galvanically isolated circuit comprising a second component having a resistance that varies in response to the environmental parameter, the output of the measurement circuit and the second measurement circuit being passed through a differential amplifier to determine a difference between the parameter experienced by the component and the parameter experienced by the second component. Alternatively, the second component could be a fixed or controllable reference resistor such that the resistance of the parameter-dependent component is measured with reference to a fixed (or known) reference resistance.

The controller may be configured to calibrate a difference between voltages across the capacitors of the measurement circuits against the duty cycles in both circuits for known values of the parameters and/or differences between the parameters experienced by the component and second component.

A similar approach may be used to compare two control parameters by comparing the voltage developed by two components.

In accordance with another aspect of the invention there is provided a system for measuring an environmental parameter experienced by a resistive component in a galvanically isolated circuit. The system comprises a measurement circuit comprising a voltage pulse generator. The measurement circuit is inductively coupled to the galvanically isolated circuit by a flyback transformer such that a stable voltage across a first capacitor in the measurement circuit after many voltage pulses is proportional to a stable voltage across a second capacitor connected across the component in the galvanically isolated circuit. The stable voltages across the first and second capacitors are adjustable by adjusting a duty cycle of the voltage pulses. The environmental parameter may be measured by measuring the stable voltage across the first capacitor, or by monitoring the duty cycle required to keep the stable voltage across the first capacitor constant as the environmental parameter varies.

When operating the circuit at a few kHz, the voltage pulses may have an average width of the order of a few μs, and a period of the order of tens or hundreds of μs. In some applications where small size components are beneficial the circuit can operate at much higher frequencies, up to and over 1 Mhz, in which case the pulses will be have a width of some ns in a period of a few μs.

In accordance with another aspect of the present invention there is provided a method for calibrating a measurement circuit for use in measuring an environmental parameter experienced by a resistive component in a galvanically isolated circuit inductively coupled to the measurement circuit by a transformer. The method comprises applying a known value of the environmental parameter to the resistive component, applying voltage pulses to the transformer from the measurement circuit, measuring a voltage across a capacitor in the measurement circuit, determining if the measured voltage is higher or lower than an expected value for the known value of the environmental parameter, adjusting a duty cycle of the voltage pulses applied to the transformer until the measured voltage matches the expected value, and storing a correlation between the known value of the environmental parameter and the duty cycle at which the measured voltage matches the expected value.

Some preferred embodiments of the invention will now be described by way of example only and with reference to the accompanying drawings, in which.

Figure 1:
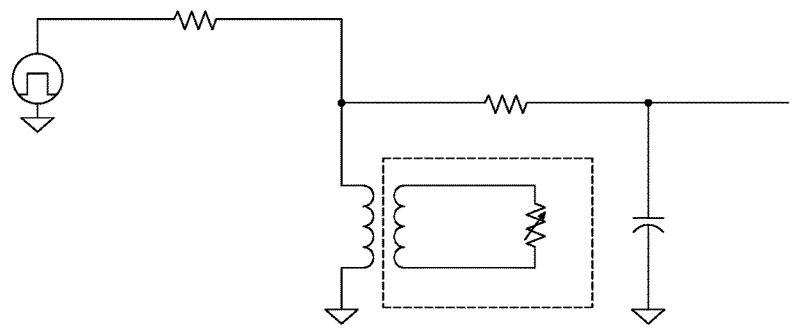
FIG. 1 shows a galvanically isolated circuit for connection to a thermistor according to the prior art.
Figure 2:
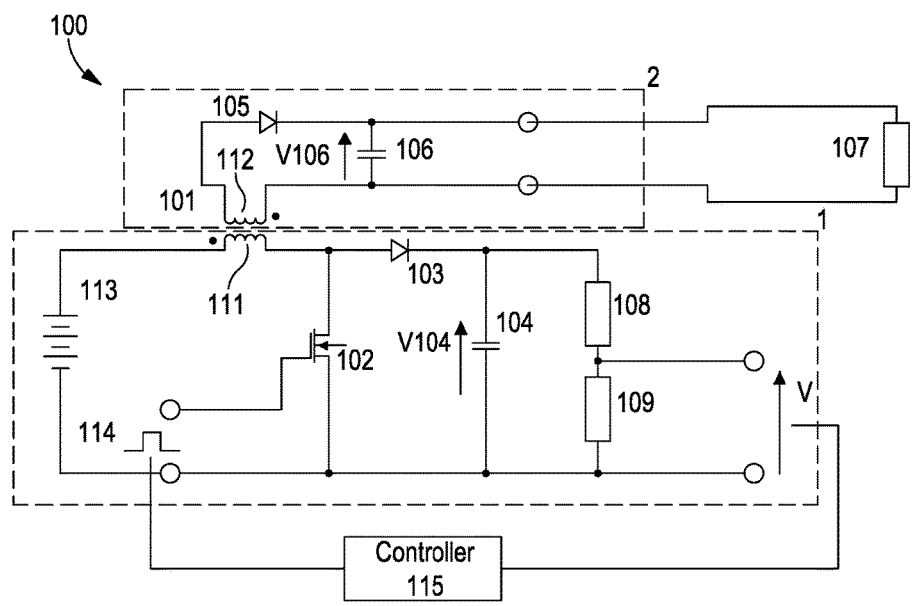
FIG. 2 shows a circuit for galvanically isolated measurement of temperature using a thermistor.

FIG. 2 shows a circuit 100 including a transformer 101 used to galvanically isolate a thermistor 107 from a measurement circuit 1. The measurement circuit is shown within dashed box 1 while the galvanically isolated section is shown in box 2. The measurement circuit includes a switching transistor 102 which may be a FET or could be a bipolar transistor. Transistor 102 is connected to a first terminal of a primary winding 111 of the transformer 101. A second terminal of the primary winding 111 is shown connected to a dc voltage supply 113. The anode of diode 103 is also connected to the first terminal of the transformer while the cathode of diode 103 is connected to a first terminal of capacitor 104, the second terminal of which is connected to a zero terminal of the dc power supply 113. As shown in FIG. 2, a potential divider 108, 109 is connected across the capacitor to facilitate measuring the voltage across the capacitor 104.

In an alternative embodiment (not shown) the second terminal of the capacitor 104 could be connected to a reference voltage. The voltage across the capacitor 104 will be representative of the temperature as will be explained below.

On the secondary side of the transformer 101, in the galvanically isolated section, a diode 105 and capacitor 106 are connected in series across the terminals of the secondary winding 112 of the transformer 101. The thermistor 107, in contact with the medium being measured, is connected across the terminals of the capacitor 106.

The measurement circuit 1 includes a pulse generator 114 connected to the gate of the transistor 102. Sending a pulse to the gate of the transistor 102 causes a voltage to be applied across the primary winding 111 of the transformer 101. For correct operation the secondary transformer connections are such that the diode 105 in the isolated circuit 2 is reverse biased when the transistor 102 is applying voltage to the primary winding 111 of the transformer. This is a connection method known in power supply circuits as flyback connection and is represented by the DOT notation in FIG. 2. During the application of the voltage pulse on the primary windings 111 no current can flow in either of the diodes 103 or 105. Energy is therefore stored in the magnetic core of the transformer during the application of this pulse. Typically therefore, the pulse length will be very short so that the core of the transformer does not saturate. In order to use a small transformer a typical pulse length would be up to a few micro-seconds but may be only nano seconds if a higher frequency controller with smaller transformers and smaller capacitors are used.

The transformer may be fabricated by closely coupled tracks on a printed circuit board without necessarily requiring a magnetic material as a core. In such a case it is beneficial to use shorter pulses and higher repetition frequency since the energy stored per pulse is smaller.

At the end of the pulse the transistor 102 is turned off, the voltage across the primary and secondary windings reverses, and the magnetic flux in the core starts to reduce. The reverse voltage allows the diodes 103 and 105 to become forward biased, dependent however, on the voltage of the capacitors 104 and 106. The current will split between the primary and secondary windings and flow through the diodes 103 and 105 in a way which will tend to equalise the voltage and turns ratio of the transformer. For example if the turns ratio is 1:1, then the current will split between primary and secondary windings of the transformer to equalise the voltage on capacitors 104 or 106. This equalising effect will occur irrespective of the value of the capacitors or the load resistors connected to each capacitor. During the off-time after each pulse the voltages act to reduce the flux in the core of the transformer. After a number of pulses (all having the same ratio of pulse time to off-time) the voltages on capacitors 104 and 106 will stabilise so that each remains at a stable, nearly constant, value. Once the capacitors have stabilised, if the turns ratio from primary to secondary is $N_1:N_2$, the voltage on capacitor 104 is $V_{104}$ and the voltage on capacitor 106 is $V_{106}$, then $$V_{104} = V_{106} \frac{N_1}{N_2}$$

The energy delivered to the transformer is controlled by the pulsing of the transistor. This means that, at a given pulse setting, the voltage $V_{106}$ on the capacitor 106 is dependent on the resistance value of the thermistor 107 connected across it. The voltage $V_{104}$ on capacitor 104 therefore will directly reflect changes in the resistance of the thermistor 107 due to temperature. Since the capacitor 104 is on the primary side of the transformer 101 the voltage $V_{104}$ on capacitor 104 is now dependent on temperature and can be measured without requiring any electrical connection to the galvanically isolated thermistor 107.

It is important to have some resistance across the capacitor 104 in the measurement circuit so that the measured voltage $V_{104}$ on capacitor 104 tracks any drops in the thermistor resistance. The resistance across capacitor 104 can also be split to create a potential divider 108, 109 so that the signal voltage is the correct magnitude to be measured, for example, in an A/D converter.

Figure 3:
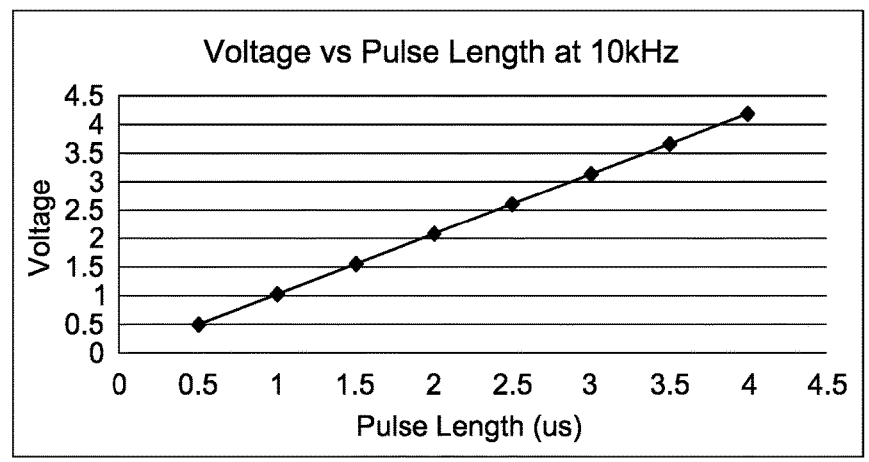
FIG. 3 shows a variation in measurement voltage with transistor pulse width using the circuit of FIG. 2 with the thermistor maintained at a constant temperature.

As previously discussed, the energy delivered to the transformer 101 is controlled by the pulsing of the transistor 102. This means that, for a given resistance of the thermistor 107, after many pulses there is a well-defined relationship between the stable voltage across the capacitor 106 (and the capacitor 104) and the pulse length (or more accurately the duty cycle). As long as the pulses are short enough that the core does not saturate it would be expected that this relationship would be linear for a given resistance of the thermistor 107. FIG. 3 shows an example of the variation in measurable voltage on capacitor 104 with variable pulse length in µs in a period of 100 µs, corresponding to a pulsing frequency of 10 kHz. The pulse length would typically be a few micro-seconds and the period would typically be tens or even hundreds of microseconds. The data in FIG. 3 was calculated for a transformer with 1:1 turns ratio, 500 µH magnetising inductance and a thermistor resistance of 10,000Ω.

Figure 4:
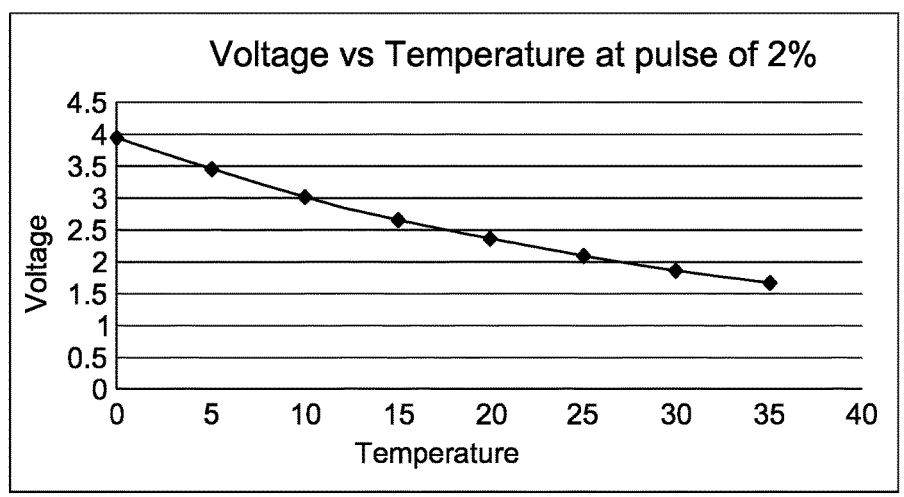
FIG. 4 shows a variation in measurement voltage with temperature using the circuit of FIG. 2.

FIG. 4 shows the voltage available for measurement on capacitor 104 with variation in temperature in ° C. for a given pulse length. The data is calculated using a typical thermistor with nominal resistance of 10 kΩ at 25° C. and with a fixed pulse width to period ratio (duty cycle) of 2%. Over this temperature range the resistance of the thermistor used in the calculation changed from 35 kΩ at 25° C. to approx 6 kΩ at 35° C.

It is typical for low cost thermistors to have tolerance variation +/−5% in the nominal resistance value at 25° C. Transformers have variations in leakage and magnetising inductance, even when identical manufacturers part numbers are chosen. The effect of all the circuit tolerances will be very significant causing unacceptable variations between nominally similar circuits. The voltage measured by this circuit could vary from a nominal value by 10, 20 or even 50%.

Figure 5:
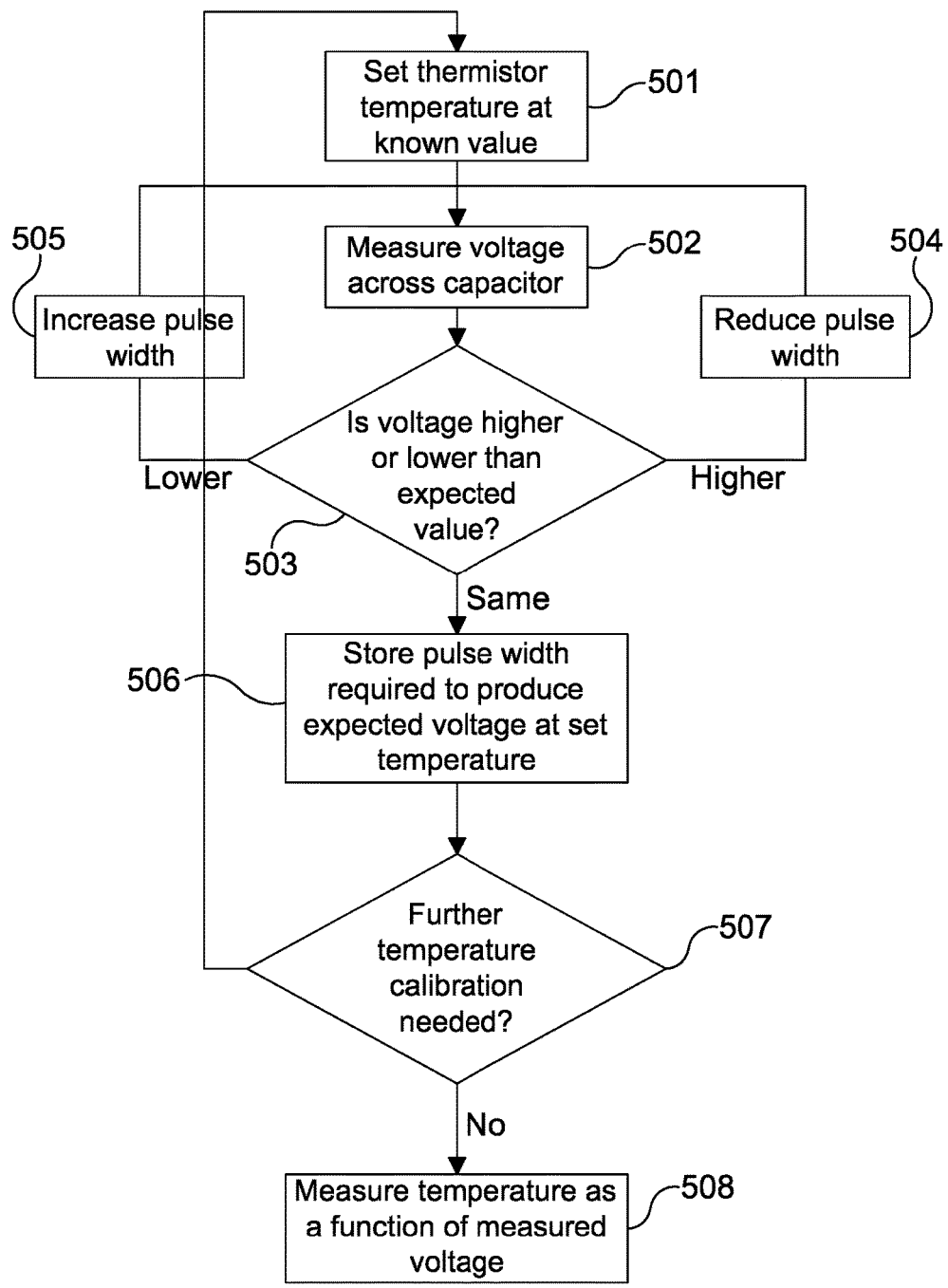
FIG. 5 is a flow chart illustrating a system for calibrating the circuit of FIG. 2.

A feature of the circuit of FIG. 2 is that it facilitates a very simple calibration to substantially eliminate all the component tolerances in one calibration, irrespective of the source of the variation. This is because the stable voltage across the capacitor depends independently on the pulse length and the resistance of the thermistor. This circuit therefore allows the use of low cost components, but after calibration can deliver measurement accuracy associated with higher precision components. A suitable calibration method is illustrated in FIG. 5 and proceeds as follows: The calibration method will now be described.

1. The circuit will usually be used with a microcontroller 115 in which the analogue measurement voltage can be converted to a digital value. For ease of calibration the pulse length delivered to transistor 102 should also be controllable.

2. The thermistor temperature should be held at a known calibration temperature 501. This could be a convenient but known temperature of for example 20° C., or possibly iced water at 0° C.
3. The voltage $V_{104}$ across capacitor 104 should be determined 502. This can be achieved by measuring the voltage across the capacitor directly, or by measuring a multiple or proportion of that voltage if an amplifier or voltage divider is used.
4. The measured value should be compared 503 to the expected value at the selected temperature, if the circuit was constructed with ideal components. The difference between the measured value and the expected value is used to produce an error signal.
5. If the measured voltage is higher than the expected value the error signal can be reduced by reducing the pulse width 504 applied to the pulsing circuit (or increasing the time between pulses).
6. If the measured voltage is lower than the expected value the error signal can be reduced by increasing the pulse width 505 applied to the pulsing circuit (or decreasing the time between pulses).
7. It is convenient to incorporate the error signal in a proportional and integral control loop so that after a period of time the output of the control loop has adjusted the pulse width to period ratio until the error signal between the measured voltage and the calibration voltage is zero.
8. At this time the value of the pulse width which has achieved zero or near zero error signal is stored and can be used to drive the circuit 508 when it is powered up on the next occasion. An advantage of using a microcontroller 115 in this circuit is that the microcontroller can perform this whole operation. The analogue voltage is measured using an A/D converter. The error can be calculated digitally relative to a digital set point, the proportional and integral controller can be implemented digitally, the pulsing circuit can be driven with a hardware pulse width modulator and finally the pulse width used after calibration is stored in non-volatile memory.
9. Experience has shown that a 10% increase in the resistance value of a thermistor over its nominal value can be nulled out with approximately a 5% decrease in the pulse width.
10. The circuit can be further calibrated at additional known temperatures 507 over the expected range of operation. For example a circuit used to measure water temperature could be calibrated at 0° C. and 100° C. and if required, at additional points between these. The pulse widths required to produce the required variation in measured voltage with temperature can therefore be stored in memory.
11. During normal operation the circuit can interpolate between stored pulse values to deliver the required pulse width for the temperature of operation (as measured by the monitored voltage).
12. In this way the circuit can have a non-linear characteristic so that the resolution and calibration of the measurement can be adjusted dynamically.

It will be appreciated that infinitely fine control of individual pulse width is not necessary: discrete pulse widths can be combined to provide intermediate average pulse widths. For example alternate pulses of width 2 µs and 2.1 µs will result in an average pulse width of 2.05 µs. If every third pulse has width 2.1 µs the average width will be 2.033 µs, etc. Furthermore, as an alternative to adjusting the pulse width, the pulse period may be altered instead or as well: in practice it is the duty cycle of the voltage pulses which determines the voltage across the capacitors.

Controller 115 may also be implemented in an application specific integrated circuit where the functions described are implemented in hardware rather than software.

It will also be appreciated that, rather than operating with a predetermined pulse width and monitoring the voltage $V_{104}$ to infer the voltage $V_{106}$ and thus the resistance of the component 106, it is also possible to vary the pulse width to maintain the measured voltage $V_{104}$ at a constant value, and use the required pulse width to monitor the resistance of the component 106. This process is very similar to the calibration described above and requires a feedback loop operated by the controller 115.

The circuit of FIG. 2 can be extended to create a multi-channel system. Each channel can be individually calibrated to produce a known signal level at a known environmental condition and each channel can be measured using a microcontroller with analogue to digital converter. Differential or relative measurements can then be taken by comparing the readings of each channel.

In some applications the difference between two channel measurements may be very small compared to the overall variation of the signal values on the two channels. In such situations, the fact that circuits according to this invention can be calibrated is a significant advantage over all the prior art.

An example where accurate differential measurements in an overall wide measurement range are required would be in a pumped heating system where it would be advantageous to measure the temperature of the flow and return water pipes and to control the speed of the circulating pump to optimise the efficiency of the heating system. The range of temperatures to be measured may be from 5° C. to 90° C. but the differential temperature between the flow and return may be fractions of a degree.

In a situation where the differential environmental measurements between two channels are very small compared to the total range of environmental conditions in which the circuit must operate an extended circuit configuration compared to that of FIG. 2 is more appropriate. A suitable circuit shown in FIG. 6.

Figure 6:
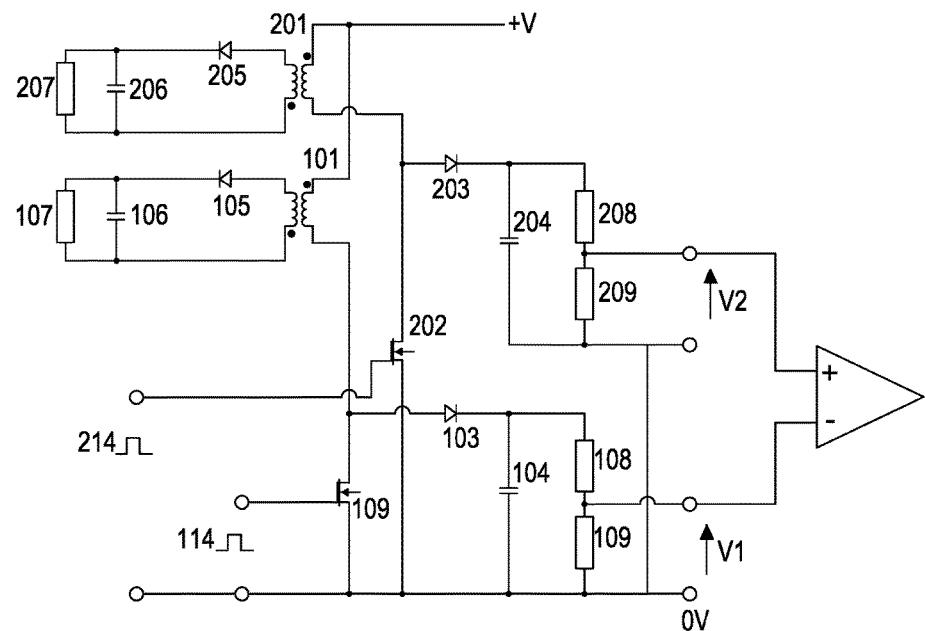
FIG. 6 shows a circuit for connection of two channels to create a differential measurement system.

In FIG. 6 the components of the first channel are identical in numeral and purpose to the single channel circuit of FIG. 2. The second channel has the same arrangement and general operating principles. The components of the second channel are numbered 2xx. Whilst each channel in FIG. 6 operates in a similar way to the single channel circuit of FIG. 2 the method to obtain an accurate difference between the measurements of the two channels is different. It is in this aspect that the method of this invention is particularly beneficial.

With two channels the variation in measurement voltage due to component tolerances is a significant problem, particularly if small differential measurements between the channels are to be detected. The two voltages representative of the thermistor resistances 107 and 207 are V1 and V2 respectively. Whilst these two voltages can be measured independently in a microcontroller it is preferable to use a differential amplifier to determine the difference and provide the option to amplify the difference to increase the resolution of the differential measurement. In FIG. 6 the differential amplifier is represented by amplifier block 110. The output of Block 110 would follow the function $A_v(V_2-V_1)$ where $A_v$ is the voltage gain of the differential amplifier. After amplification the errors due to component tolerances are also amplified. The simple calibration method which eliminates these errors will now be described.

1. Both thermistors 107 and 207 should be allowed to stabilise at the same temperature;
2. Pulses are applied to transistors 102 and 202 from a microcontroller or similar circuit (not shown in FIG. 6);
3. The pulse applied to one channel (for example transistor 202) can be set to a fixed and predetermined length. This pulse length should be chosen to ensure that the voltage V1 is suitably positioned in its available voltage range given that it will need to change with operating temperature. The exact value of the output voltage V1 is not crucial to the accuracy of the differential measurements.
4. The calibration routine will then start by applying a similar length of pulse and pulse frequency to the second channel transistor 102.
5. The differential voltage (after the amplifier if present) is then measured, usually by a microcontroller with an analogue to digital converter.
6. If the differential voltage signal is non-zero under conditions when the thermistors are at an equal temperature, then the pulse length to transistor 102 should be increased or decreased until the differential voltage signal is brought to zero.
7. As implemented in FIG. 6, a positive differential voltage signal means that the output from V2 is higher than V1 despite both thermistors being at the same temperature. The measured positive differential voltage under these conditions is therefore the calibration error.
8. Increasing the pulse time to transistor 102 would tend to increase the voltage V1 and reduce the error.
9. A simple integral controller or proportional+integral controller can sum the errors and make adjustments to the pulse width of transistor 102 to drive the differential voltage signal to zero.
10. At this time the value of the pulse widths which have achieved zero error are stored and can be used to drive the circuit when it is powered up on the next occasion. An advantage of using a microcontroller in this circuit is that the microcontroller can perform this whole operation. The differential voltage signal (or the two individual voltages) is (are) measured using an A/D converter. The error can be calculated digitally relative to zero, the proportional and integral controller can be implemented digitally, the pulsing circuit can be driven with a hardware pulse width modulator and finally the standard pulse used for 202 and the pulse width used for 102 after calibration are stored in non-volatile memory.

After calibration the thermistors can follow the temperatures of the application and differences in the temperature can be detected to a surprising accuracy despite the use of low cost components with significant component tolerances.

The circuit of FIG. 6 therefore achieves very accurate differential temperature measurements without the use of closely matched components. Furthermore the circuit provides complete electrical isolation to the thermistors without requiring expensive isolated power supplies. This is achieved by the way in which the voltage across the thermistor is reflected back to the primary side of the transformer where it can be easily measured and calibrated.

The differential circuit with amplifier can also be used as a more accurate single channel circuit by replacing one of the thermistors with a fixed resistor with a value close to the value of the thermistor at the calibration temperature.

Temperature measurement circuits employing thermistors have been described to illustrate the simplicity of the invention and the way in which low cost components can be used and variations between measurements can easily be nulled out using simple calibration methods.

Figure 7:
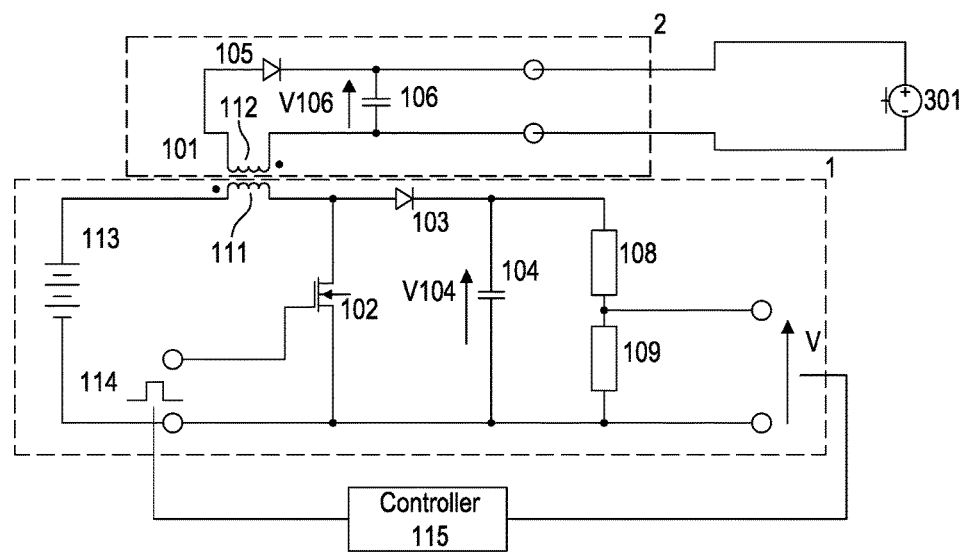
FIG. 7 shows a circuit for galvanically isolated measurement of a control voltage.

The same circuit can also be used to measure a voltage developed by a component. FIG. 7 shows the circuit 100 including a transformer 101 used to galvanically isolate a variable control voltage 301 from the measurement circuit 1. As in FIG. 2, the measurement circuit is shown within dashed box 1 while the galvanically isolated section is shown in box 2. The measurement circuit includes a switching transistor 102 which may be a FET or could be a bipolar transistor. Transistor 102 is connected to a first terminal of a primary winding 111 of the transformer 101. A second terminal of the primary winding 111 is shown connected to a dc voltage supply 113. The anode of diode 103 is also connected to the first terminal of the transformer while the cathode of diode 103 is connected to a first terminal of capacitor 104, the second terminal of which is connected to a zero terminal of the dc power supply 113. In FIG. 7, as in FIG. 2, a potential divider 108, 109 is connected across the capacitor 104 to facilitate measuring the voltage across the capacitor 104.

On the secondary side of the transformer 101, in the galvanically isolated section, a diode 105 and capacitor 106 are connected in series across the terminals of the secondary winding 112 of the transformer 101. The variable control voltage 301 is connected across the terminals of the capacitor 106. The control voltage may be received from an industrial controller in which control information is transmitted by a variable voltage between 0V and 10V. As an alternative the variable control voltage may be developed across a receiving resistance through which a control current passes. The control current in an industrial control system is typically between 4 mA and 20 mA. A commonly accepted receiver resistor would be 250Ω. A control current of 4 mA therefore develops a voltage of 1V across the receiver resistor. A control current of 20 mA develops a voltage of 5V across the receiver resistor. It will be appreciated that these figures are exemplary, and the circuit will work with other figures. The variable control voltage is represented by the source voltage 301 in FIG. 7.

As with the previous implementations of the invention the value of variable control voltage can be inferred from the voltage across capacitor 104. Calibration of the circuit can also take place in the same way as with the description of the calibration of a thermistor above. A known control voltage is connected to the terminals of the galvanically isolated part of the circuit. Pulses are applied to transistor 102, and the stable voltage $V_{104}$ across capacitor 104 is determined. This can be achieved by measuring the voltage across the capacitor directly, or by measuring a multiple or proportion of that voltage if an amplifier or voltage divider is used. Ideally the control voltage should be varied to calibrate the voltage developed across the capacitor 104 over a reasonable proportion of the normal range of the control voltage.

Calibration of the expected measurement at a first known control voltage can be implemented in the same way as for temperature as shown in FIG. 5. The pulse width can be adjusted to account for all the variations and tolerances of the circuit such that the expected voltage is achieved when the known control voltage is applied to the galvanically isolated terminals. Measurement of the voltage obtained on capacitor 104 at a further known control voltage provides data of both slope and offset of the measured voltage. These calibration values can be stored in the controller 115.

After calibration measurement of a control voltage is achieved by operating the circuit with a pulse width and duty cycle determined from the calibration values and measuring the voltage across capacitor 104 or a voltage derived from that voltage. The voltage on capacitor 104 is directly related to the control voltage and therefore the control voltage can be determined through a galvanically isolated measurement circuit.

The circuit of this invention can therefore be used as a simple galvanically isolated method to measure a control voltage while using very simple components and employing a calibration method to create an accurate measurement despite tolerance variations from one circuit to another.

It will be appreciated that variations from the embodiments described above may still fall within the scope of the invention. For example, the embodiments involving the monitoring of resistance have been described in the context of the measurement of temperature using a thermistor. However, measurement of any parameter which can cause a change in resistance may also be monitored in the same way. The measurement method described can also be used to measure a variable resistance or potentiometer. Often it is necessary to use a potentiometer as a variable input to a control circuit. Using a potentiometer in the circuit of FIG. 2 in place of thermistor 107 will produce a variable and isolated voltage across resistor 109 as the resistance of the potentiometer (107) is varied. Differential measurements between two potentiometers or between a potentiometer and a fixed resistor can be achieved using FIG. 6. It may also be possible to measure changes of capacitance using circuits similar to those shown in FIGS. 2 and 6.

The invention claimed is:

1. A system for monitoring a resistance of a component, the system comprising:
  a measurement circuit comprising a primary inductor, a voltage pulse generator for applying voltage pulses across the primary inductor, a first capacitor and a first resistance connected across the first capacitor;
  a galvanically isolated circuit including a secondary inductor, a second capacitor coupled to the secondary inductor, and the component connected across the second capacitor; and
  a measuring device for measuring a voltage across the first capacitor,
  wherein the primary and secondary inductors are inductively coupled by a magnetic core to form a flyback transformer; and
  wherein the galvanically isolated circuit is configured to prevent a current induced in the secondary inductor by the primary inductor during the voltage pulses from flowing in a first direction through the galvanically isolated circuit, so that energy from the voltage pulses is stored in the magnetic core, and
  configured to permit current to flow in a second direction through the galvanically isolated circuit between pulses, so that the energy stored in the magnetic core is released into the first and second capacitors, whereby after a plurality of the voltage pulses the system is in a substantially stable state, in which a substantially stable voltage $V_{C1}$ across the first capacitor is proportional to a substantially stable voltage $V_{C2}$ across the second capacitor, and $V_{C1}$ is representative of the resistance of the component.

2. The system of claim 1, wherein $V_{C1}$ and $V_{C2}$ are variable in dependence on the duty cycle of the voltage pulses.

3. The system of claim 2, wherein $V_{C1}$ and $V_{C2}$ are substantially proportional to the duty cycle of the voltage pulses.

4. The system of claim 1, wherein the component is configured to monitor an environmental parameter, such that a change in the environmental parameter results in a change in resistance of the component.

5. The system of claim 4, wherein the component is a thermistor and the environmental parameter is temperature.

6. The system of claim 4, further comprising a controller configured to monitor a measured value of $V_{C1}$, and to determine a value of the environmental parameter or control parameter from $V_{C1}$.

7. The system of claim 6, wherein the controller is coupled to the voltage pulse generator, and is configured to calibrate a relationship between $V_{C1}$ and the environmental parameter or control parameter by measuring $V_{C1}$ when the component experiences a known constant value of the parameter, calculating an error from an expected value of $V_{C1}$ for the known value, and adjusting the duty cycle of the voltage pulses until $V_{C1}$ matches the expected value.

8. The system of claim 7, wherein the controller is configured to store the duty cycle at which $V_{C1}$ matches the expected value.

9. The system of claim 7, wherein the controller is configured to calibrate $V_{C1}$ for two or more known values of the parameter experienced by the component, store the required duty cycle for each known value, and use the stored duty cycles to choose a suitable duty cycle when measuring an unknown value of the environmental parameter or control parameter.

10. The system of claim 6, further comprising a second measurement circuit and a second galvanically isolated circuit comprising a second component that has a resistance that varies in response to the environmental parameter or a voltage developed by it representative of the control parameter, the output of the measurement circuit and the second measurement circuit being passed through a differential amplifier to determine a difference between the parameter experienced by the component and the parameter experienced by the second component.

11. The system of claim 10, wherein the controller is configured to calibrate a difference in voltages across the capacitors of the measurement circuits against the duty cycles in both circuits for known values of the parameters and/or differences between the parameters experienced by the component and second component.

12. The system of claim 6, further comprising a second measurement circuit and a second galvanically isolated circuit comprising a second component that has a fixed or controllable resistance usable as a reference resistance or a fixed or controllable voltage developed by it usable as a reference voltage, the output of the measurement circuit and the second measurement circuit being passed through a differential amplifier to determine a difference between the resistance of or voltage developed by the component and the reference resistance of or voltage developed by the second component.

13. The system of claim 1, wherein the voltage pulse generator comprises a voltage source and a pulse generator connected to a gate of a transistor.

14. The system of claim 1, wherein the measurement circuit comprises a first diode connected in series with the first capacitor such that the first diode is reverse biased during the voltage pulses.

15. The system of claim 1, wherein the galvanically isolated circuit comprises a second diode connected in series with the second capacitor such that the second diode is reverse biased during the voltage pulses so as to prevent current flow in the first direction.

16. The system of claim 1, wherein the voltage pulses have an average width of the order of a few µs.

17. The system of claim 1, wherein the voltage pulses have a period of the order of tens or hundreds of µs.

18. A system for monitoring a voltage developed by a component, the system comprising:
a measurement circuit comprising a primary inductor, a voltage pulse generator for applying voltage pulses across the primary inductor, a first capacitor and a first resistance connected across the first capacitor;
a galvanically isolated circuit including a secondary inductor, a second capacitor coupled to the secondary inductor, and the component connected across the second capacitor; and
a measuring device for measuring a voltage across the first capacitor,
wherein the primary and secondary inductors are inductively coupled by a magnetic core to form a flyback transformer; and
wherein the galvanically isolated circuit is configured to prevent a current induced in the secondary inductor by the primary inductor during the voltage pulses from flowing in a first direction through the galvanically isolated circuit, so that energy from the voltage pulses is stored in the magnetic core, and
configured to permit current to flow in a second direction through the galvanically isolated circuit between pulses, so that the energy stored in the magnetic core is released into the first and second capacitors, whereby after a plurality of the voltage pulses the system is in a substantially stable state, in which a substantially stable voltage $V_{C1}$ across the first capacitor is proportional to a substantially stable voltage $V_{C2}$ across the second capacitor, and $V_{C1}$ is representative of the voltage developed by the component.

19. The system of claim 18, wherein the voltage developed by the component is representative of a control parameter, such that a change in the control parameter results in a change in voltage to be monitored.

20. The system of claim 19, wherein the control parameter is a control signal in the form of a variable voltage or a voltage developed by a control current passing through a known resistance.

21. A system for measuring an environmental parameter experienced by a resistive component in a galvanically isolated circuit, the system comprising:
a measurement circuit comprising a voltage pulse generator and a first capacitor, the measurement circuit being inductively coupled to the galvanically isolated circuit by a flyback transformer such that a stable voltage across the first capacitor in the measurement circuit after a plurality of voltage pulses is proportional to a stable voltage across a second capacitor connected across the component in the galvanically isolated circuit, the measurement circuit being configured to adjust said stable voltages across the first and second capacitors by adjusting a duty cycle of the voltage pulses.

22. The system of claim 21, configured to measure the environmental parameter by measuring the stable voltage across the first capacitor.

23. The system of claim 21, configured to measure the environmental parameter by measuring the duty cycle required to keep the stable voltage across the first capacitor constant.

24. A method for calibrating a measurement circuit for use in measuring an environmental parameter experienced by a resistive component in a galvanically isolated circuit inductively coupled to the measurement circuit by a transformer, the method comprising:
applying a known value of the environmental parameter to the resistive component;
applying voltage pulses to the transformer from the measurement circuit;
measuring a voltage across a capacitor in the measurement circuit;
determining if the measured voltage is higher or lower than an expected value for the known value of the environmental parameter;
adjusting a duty cycle of the voltage pulses applied to the transformer until the measured voltage matches the expected value;
correlating the known value of the environmental parameter and the duty cycle at which the measured voltage matches the expected value; and
storing the correlation.

25. A method for calibrating a measurement circuit for use in measuring a control parameter represented by a voltage developed by a component in a galvanically isolated circuit inductively coupled to the measurement circuit by a transformer, the method comprising:
applying a known value of the control parameter to the component;
applying voltage pulses to the transformer from the measurement circuit;
measuring a voltage across a capacitor in the measurement circuit;
determining if the measured voltage is higher or lower than an expected value for the known value of the control parameter;
adjusting a duty cycle of the voltage pulses applied to the transformer until the measured voltage matches the expected value; and
correlating the known value of the control parameter and the duty cycle at which the measured voltage matches the expected value; and
storing the correlation.

* * * * *